United States Patent [19]

Jolivet et al.

[11] 4,049,910

[45] Sept. 20, 1977

[54] DIGITAL SIGNAL TRANSMISSION SYSTEM

[75] Inventors: Jean-Claude Jolivet, Saint-Michel-en-Greve; Francois-Xavier Stouls, Perros Guirec, both of France

[73] Assignee: Societe Anonyme de Telecommunications, Paris, France

[21] Appl. No.: 671,824

[22] Filed: Mar. 30, 1976

[30] Foreign Application Priority Data

Apr. 18, 1975 France .................. 75.12179

[51] Int. Cl.² .............................................. H04L 7/04
[52] U.S. Cl. ............................ 178/69.1; 179/15 BS; 178/53
[58] Field of Search ................. 178/DIG. 3, 53, 69.1; 325/38 R, 38 B; 179/15 BS, 15.55 R

[56] References Cited

U.S. PATENT DOCUMENTS

| 3,435,134 | 3/1969 | Richards | 178/DIG. 3 |
| 3,809,805 | 5/1974 | Kasprzak | 179/15.55 R |

*Primary Examiner*—Benedict V. Safourek
*Attorney, Agent, or Firm*—Holman & Stern

[57] ABSTRACT

A transmission system of the kind comprising, on emission, a code converter for coding said signals into variable length words according to their occurrence probabilities, the word rate being determined by an emission clock, a synchronizing word generator operating at a frequency bound to said emission frequency, means for multiplexing words from the code converter and synchronizing-words, and an elastic memory connected to said multiplexing means, and, on reception, an elastic memory connected to said emission elastic memory, reading on emission and writing on reception being carried out at a rate determined by a transmission clock, means for detecting synchronizing-words at the output of said reception-memory and a decoder for deriving said signals from said variable length words, said system further comprising, on emission, means for supplying to said multiplexing means the drift of said emission frequency with respect to a frequency bound to said transmission frequency, and, on reception, a controlled oscillator supplying a timing signal for reading said reception memory, means for detecting said drift, said means being controlled by the synchronization-detection; and means for recovering said emission frequency from said drift and said frequency bound to the transmission frequency, said recover means controlling said oscillator.

2 Claims, 1 Drawing Figure

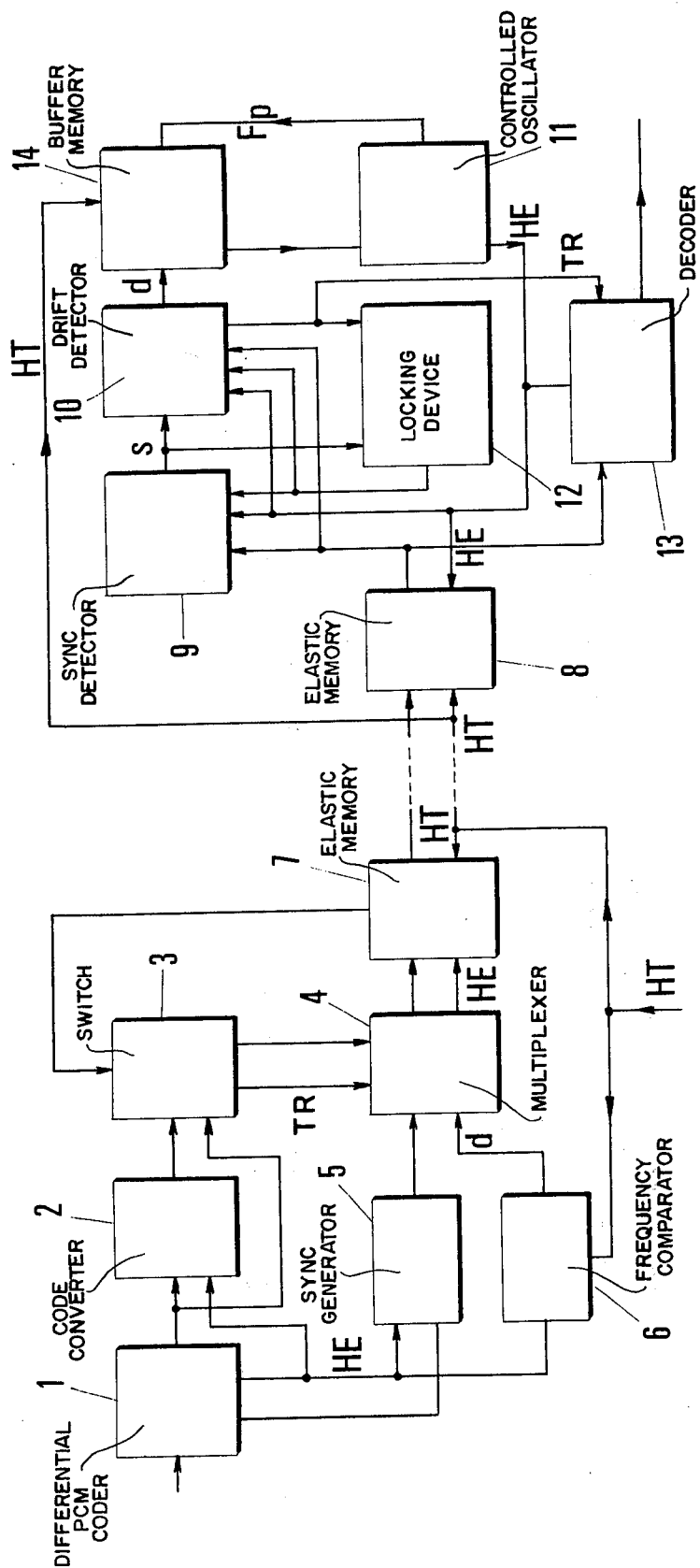

DIGITAL SIGNAL TRANSMISSION SYSTEM

The present invention relates to the transmission of digital signals having particular statistical characteristics such as video signals, for example from videophone.

The transmission of coded signals on digital channels is normally performed by characterising each sample by a word having a fixed number of binary digits. However, when the words to be transmitted have particular statistical characteristics the same information can be transmitted with a smaller digit rate by using the variable length coding, the word containing so many fewer binary digits the more it is probable.

In principle, the coding into variable length words is already known. The article by R. F. Rice and J. R. Plaunt published in the I.E.E.E. Trans. on Communication Technology on Dec. 6th, 1971, described a method for performing a compression on the basis of an asynchronous coding.

Such a coding procedure can be applied to video signals. A video signal is produced by line scanning of the image, each line comprising a certain number of points. When sampling the video signal and considering the jumps, or differences between the amplitudes of two successive samples, it will be understood that low jumps, which correspond to low luminance variations, are far more probable than large jumps, which correspond to abrupt variations. Accordingly, a differential PCM coding of the analog video signal yields signals to which a variable length coding will be advantageously applied.

Another example of an asynchronous coding procedure comprises the conditional system. In this case, the information are transmitted only when certain conditions have been fulfilled, for instance on exceeding a threshold. Such a system was described in the Bell System Technical Journal, Vol. 50, No. 6, pages 1889 to 1919, in July, 1971 by J. C. Candy, M. A Franke, B. G. Haskell and F. W. Mounts, and entitled "Transmitting Television as Clusters of Frame Difference".

On purpose to perform a synchronous transmission, at a constant digit rate, of synchronous signals, there are necessarily provided an elastic buffer memory on emission and another on reception of the regulation of the digit rate, since the words written into the emission memory comprise a variable number of binary digits. However, the transmission frequency is not bound to the original frequency at which words have been written into the emission memory, and it is necessary to recover the original frequency on reception for reconstructing a signal identical with the emission signal and providing for synchronism between the two buffer memories.

The object of the invention is to provide a data transmission system which carries out such a recovering of the original frequency.

There is provided according to the invention a digital transmission system of the kind comprising, on emission, a code converter for coding said signals into variable length words according to their occurrence probabilities, the word rate being determined by an emission clock, a synchronising word generator operating at a frequency bound to said emission frequency, means for multiplexing words from the code converter and synchronising words, and an elastic memory connected to said multiplexing means, and, on reception, an elastic memory connected to said emission elastic memory, reading on emission and writing on reception being carried out at a rate determined by a transmission clock, means for detecting synchronising words at the output of said reception memory and a decoder for deriving said signals from said variable length words, said system further comprising, an emission, means for supplying to said mulitplexing means the drift of said emission frequency with respect to a frequency bound to said transmission frequency, and, on reception, a controlled oscillator supplying a timing signal for reading said reception memory, means for detecting said drift, said means being controlled by the synchronisation detection; and means for recovering said emission frequency from said drift and said frequency bound to the transmission frequency, said recover means controlling said oscillator.

When the signal to be transmitted has statistics which differ too much from the average statistics, underloading or overloading of the emission elastic memory can occur. To allow for regulation the load of said memory, the digital transmission system according to the invention, wherein the digital signals are supplied to said code converter by a differential PCM coder, comprises switch means having inputs connected to said code converter and said differential PCM coder, respectively, and outputs connected to said multiplexing means, and another input connected to said emission memory for receiving a signal representative of the load level thereof, said switch means delivering signals from said coder when said load level is below a predetermined low level or when the average length of words from said code converter is above that of words from said coder, and switching off transmission when said load level is above a predetermined high level, said switch means delivering at one of its outputs a signal representative of the selection carried out, said signal being detected on reception by said drift detecting means and fed to said decoder.

The invention will be better understood from the following description of one embodiment, referring to the drawing which is a block diagramm of the data transmission system of the invention.

The described embodiment is directed to the transmission of a videophone signal obtained as a result of line scanning the image. The signal comprises at each line the video signal itself and a blanking. The blanking duration is used for transmitting a synchronising signal. For instance, a line comprises 256 image points, or which 216 are allocated to the video signal and 18 to the synchronising signal.

The analog videophone signal is fed to a differential PCM coder 1. Coder 1 effects coding of the differences between amplitudes of successive samples, not of the amplitudes themselves, and delivers three-bit words, each word representing one image point, at the rate of the clock HE which delivers a frequency of 2.048 MHz. The digit rate at the output of coder 1 is therefore $3 \times 2.048 = 6.144$ Mbits/sec.

A code converter 2 derives from the three-bit words from coder 1 words comprising a variable number of digits ranging from 1 to 8. The length of the word from code converter 2 depends on the probability of occurrence of said word, the more probable words corresponding to the shorter words (1 or 2 digits) at the output of code converter 2. It will be readily understood that in the case of a video signal, all the signals do not ocrur with the same probabilities since low jumps corresponding to low luminance variations are much more frequent than large jumps which correspond to abrupt variations. Code converter 2 delivers for instance signals in form of 0,01,011, . . .0 111 1111, each "0" forming the beginning of a word. Code converter 2 supplies words at the rate of clock HE, and thus the digit rate at its output ranges from 2.048 Mbits/sec to 8 × 2.048 Mbits/sec.

Words from code converter 2 are entered into an elastic memory 7 by way of a switch 3 and a multiplexer 4. Elastic memory 7 together with switch 3 allows for regulation of the digit rate which is as recited above very irregular at the output of code converter 2. Switch 3 has an input directly connected to coder 1 and is further able to cause transmission interruption during one line. It is controlled by a signal representative of the load level of elastic memory 7.

The average digit rate at the output of memory 7 is about two digits per word. Nevertheless, if the memory is underloaded, which may result in transmission errors, switch 3 transmits the three-digit words from coder 1, not words from code converter 2. Transmission of words from coder 1 also takes place during one line when the average rate on the preceding line exceeds 3 digits per word. Moreover, if memory is overloaded, switch 3 cuts off data transmission during one line, the interruption involving on reception repetition of the preceding line.

Switch 3 further feeds to multiplexer 4 a signal TR representative of the code selection carried out. Two binary digits would suffice for defining TR since three cases can take place, but each of said digits is triplicated to permit majority detection on reception. Signal TR thus comprises 6 bits.

Multiplexer 4 also receives synchronising words supplied by a generator 5 at the rate of clock HE. A synchronising word comprises a 15-digit pseudo-random sequence and is delivered one time per line at the occurence of the edge of the synchronising signal contained in the incoming signal.

Multiplexer 4 inserts signal TR after the synchronising word from generator 5 which takes place during the blanking of the incoming video signal. The multiplexed signal is written into elastic memory 7 at a word rate defined by clock HE, and the data are transmitted from memory 7 to another elastic memory 8 at the rate of a transmission clock HT bound to the transmission channel. Since word length is varying due to code conversion, transmission frequency does not depend on emission frequency HE, and it is necessary to recover frequency HE on reception for reconstructing the signal and synchronising writing into memory 7 and reading from memory 8.

For this purpose, multiplexer 4 is supplied with a signal $d$ representative of the drift of frequency HE with respect to a frequency bound to transmission frequency HT, for instance $k.HT$. Signal $d$ is delivered by a frequency comparator 6, the value of $k$ being such that the difference, on one line, between HE and $k.HT$ may be expressed by one binary digit. This information is inserted by multiplexer 4 after code selection signal TR delivered by switch 3.

On reception, the data are read from memory 8 at the rate of frequency HE recovered by a controlled oscillator 11 in a manner described below. Then a synchronisation detector 9 investigates a synchronisation sequence by detecting the number of coincidences between the digits received and the synchronising word stored.

The recovering of frequency He is obtained in the following manner. When starting, drift information $d$ is read from memory 8 at the natural frequency of oscillator 11 and is detected, like code selection signal TR, in a detector 10 after detector 9 has recognized the synchronising word and delivered a signal S.

Information $d$ is written into a buffer memory 14 at the rate of frequency FN and read at a frequency FP delivered by oscillator 11, corresponding to the emission line frequency. According to the value of drift $d$, either a pulse is substracted from the stored frequency $k.HT$, $k$ being as above, or $k.HT$ remains unchanged. The output signal drives oscillator 11, which comprises at its input a phase loop including a phase comparator and a low-band filter (not showed) for eliminating jumps at the time of pulse suppressions, and oscillator 11 is thus controlled by emission frequency HE.

The recognition of the synchronisation word is performed by means of locking device 12. The synchronisation detected 9 investigates the first group, consisting of the same number of digits as a word and identical to the synchronising words. However, in the special case of the invention for words of variable length, it is no longer possible to count the number of clock pulse to recognise the synchronising sequence, and the signal received must be decoded to lock the synchronisation.

Synchronisation is investigated within a window determined by the locking device, comprising a time base which is reset when detector 9 supplies locking device 12 with signal S corresponding to a detection. The window is determined as a compromise between a narrow window preventing false synchronisations being found on the signal and a wide window which prevents any possible errors on a group of words from causing a loss of this synchronisation.

When the system is not locked, the first group identical to the synchronisation word at 9 is investigated, the code selection and drift information are detected at 10 and the following binary digits are decoded in a decoder 13 in accordance with the detected code selection. If a synchronising word is then found at the expected place, permitting an error on this word to minimise the influence of digital transmission errors, locking of the system takes place. However, locking is considered to be lost when the synchronising word is no longer found within the window, and it is then no longer possible to find the code selection information. Locking depends on the recognition of the synchronising word and the expected position of the synchronising word. Thus, there are two types of error permitted in connection with the criterion of maintaining locking in the case of transmission of variable length words. To minimise the influence of transmission errors, because an error can cause the shifting of one word, a variation of ± 4 words on the expected synchronsation position is accepted.

The transmission system, according to the invention, tested in the presence of transmission errors, can be used for error up to $5 \times 10^{-4}$.

Decoder 13 supplies at its output binary digits at a rate of three digits per word at a frequency of 2.048 MHz in the case of the videophone, i.e. carries out reconstruction of the words from coder 1.

The described embodiment is related to a videophone where one word is represented by three binary digits. An application of this system has been implemented in the case of the transmission of a television signal using a variable word length code. In telephony, it can also be applied to PCM signals, or in general manner to any system for which the amount of information between two synchronising words is not constant.

What we is claim is:

1. A transmission system of the kind for transmitting and receiving digital signals over a transmission line, said system comprising: for transmission, a code converter for coding said signals into variable length words according to their occurrence probabilities, the word rate being determined by an emission clock for establishing an emission frequency, a synchronising word generator operating at a frequency bound to said emission frequency, means for multiplexing words from the code converter and the synchronising word generator forming variable length words, and a first elastic memory connected between said multiplexing means and said transmission line, and for reception, a second elastic memory connected to said transmission line, reading on transmission and writing on reception being carried out at a rate determined by a transmission clock, means for detecting synchronising words at the output of said second elastic memory and a decoder for deriving digital signals from said variable length words from said second elastic memory, said system for transmission further comprising, for transmission, means for supplying to said multiplexing means a signal representative to the drift of said emission frequency with respect to a frequency bound to said transmission frequency, and, for reception, a controlled oscillator supplying a timing signal for reading said reception memory, means for detecting said signal representative of the drift, said means for detecting said signal being controlled by said means for detecting synchronising words;

and means for recovering said emission frequency from said drift and said frequency bound to the transmission frequency, said recover means controlling said oscillator.

2. A digital transmission system according to claim 1, wherein the digital signals are supplied to said code converter by a differential PCM coder, comprising switch means having first and second inputs connected to said code converter and said differential PCM coder, respectively, and outputs connected to said multiplexing means, and a third input, connected to said first elastic memory, for receiving a signal representative of the load level thereof, said switch means delivering signals from said coder when said load level is below a predetermined low level or when the average length of words from said code converter is above that of words from said coder, and switching off transmission when said load level is above a predetermined high level, said switch means delivering at one of its outputs a signal representative of the selection carried out, said signal being detected on reception by said drift detecting means and fed to said decoder.

* * * * *